United States Patent [19]
Beacham, Jr. et al.

[11] Patent Number: 5,488,323
[45] Date of Patent: Jan. 30, 1996

[54] TRUE HYSTERESIS WINDOW COMPARATOR FOR USE IN MONITORING CHANGES IN SWITCH RESISTANCE

[75] Inventors: William H. Beacham, Jr., Enfield, Conn.; Erik C. Lillestolen, Colorado Springs, Colo.

[73] Assignee: United Technologies Corporation, Hartford, Conn.

[21] Appl. No.: 355,482

[22] Filed: Dec. 14, 1994

[51] Int. Cl.⁶ .................................................. H03K 5/153
[52] U.S. Cl. ................................ 327/74; 327/77; 324/500
[58] Field of Search .................... 327/58–77; 324/500, 324/508

[56] References Cited

U.S. PATENT DOCUMENTS

| | | | |
|---|---|---|---|
| 3,743,945 | 7/1973 | Sellari, Jr. | 328/28 |
| 4,300,063 | 11/1981 | Dunphy et al. | 327/76 |
| 4,348,602 | 9/1982 | Sauer | 327/66 |
| 4,406,955 | 9/1983 | Lo Cascio | 327/66 |
| 4,618,770 | 10/1986 | Maile | 250/338 |
| 4,820,940 | 4/1989 | Wachi et al. | 307/270 |
| 5,019,722 | 5/1991 | Hess et al. | 307/354 |
| 5,140,591 | 8/1992 | Palara et al. | 307/270 |
| 5,155,386 | 10/1992 | Abdi | 307/355 |

Primary Examiner—Timothy P. Callahan
Assistant Examiner—Kenneth B. Wells
Attorney, Agent, or Firm—Richard H. Kosakowski; Holland & Associates

[57] ABSTRACT

Electronic circuitry is disclosed for interfacing with a plurality of two-position switches to determine if each switch is opened, closed or faulty to some extent. Each switch is connectable in series with a pull-up resistor and between two different voltage values. The switch provides an output voltage at the connection of one terminal of the switch with the pull-up resistor. This switch voltage is presented to both an inverting input of a first comparator and a non-inverting input of a second comparator. The non-inverting input of the first comparator has a reference voltage of a certain value applied thereto, while the inverting input of the second comparator has a reference voltage of a certain value also applied thereto, the reference voltage values being different so as to define a "window" or "dead band" region of voltage. The switch output voltage is compared to the reference voltages on the two comparators. If the switch is closed, the comparator outputs will assume certain states. On the other hand, if the switch is opened, the comparator outputs will assume the opposite states. Finally, if the switch is faulty such that a finite impedance value is developed across the terminals of the switch, the voltage value will then be generated which causes both comparator outputs to assume the same state, thereby indicating a faulty switch to subsequent signal processing circuitry.

20 Claims, 1 Drawing Sheet

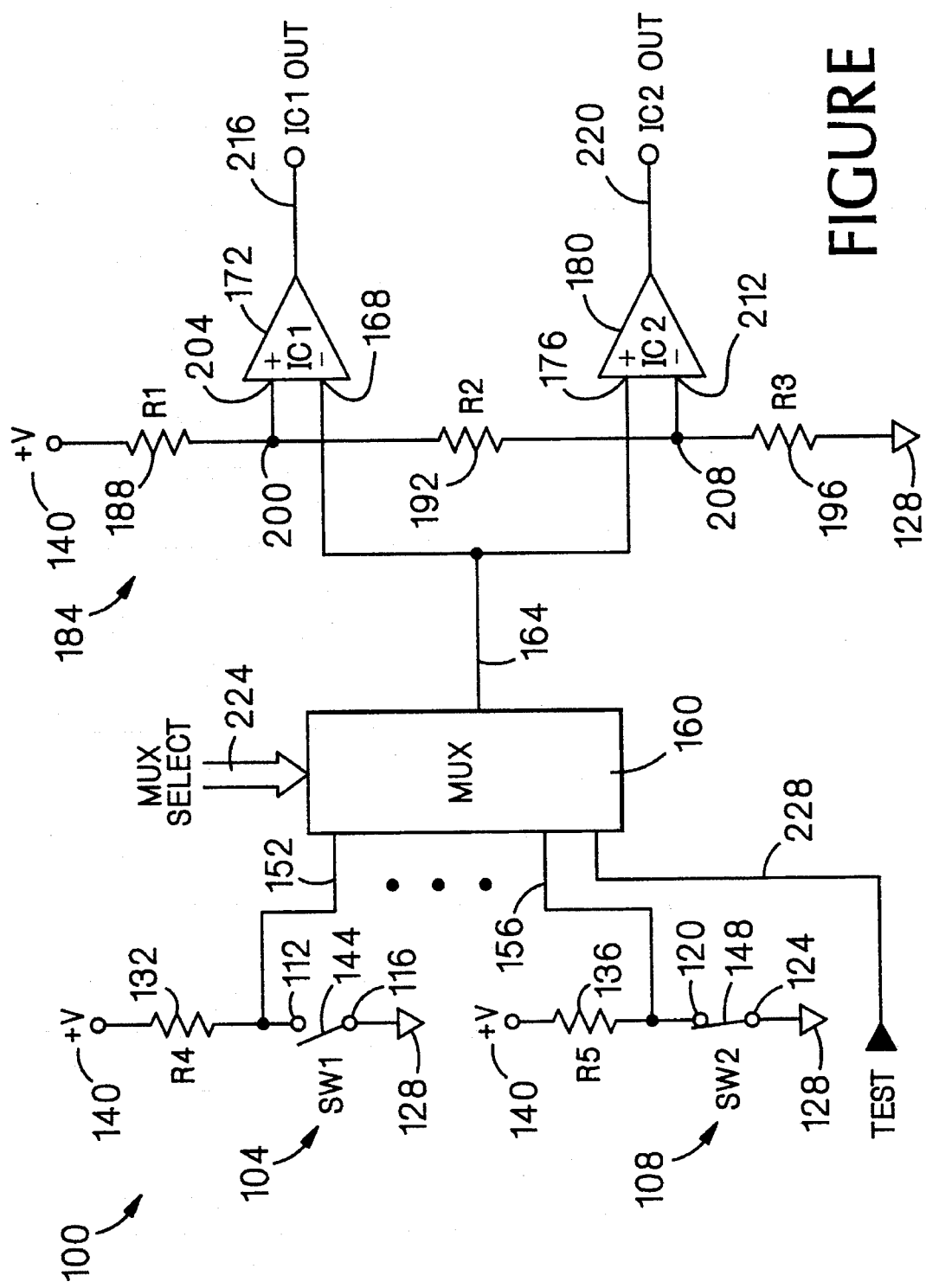

TRUE HYSTERESIS WINDOW COMPARATOR FOR USE IN MONITORING CHANGES IN SWITCH RESISTANCE

BACKGROUND OF THE INVENTION

This invention relates to a switch interface and, more particularly, to an electronic circuit capable of determining if a two-position switch is opened, closed or faulty to some extent.

Two-position (i.e., "ON/OFF", "OPENED/CLOSED") mechanical switches are used in countless electronic and electrical circuits for various applications. For example, the switches may be manually or automatically moveable or controlled, and their status indicative of certain desired or actual conditions within a system, such as an aircraft flight control.

A simple electrical connection for a two-position switch is to have one terminal of the switch connected to electrical ground, and a second terminal connected to one side of a pull-up resistor, the other side of the resistor connected to a voltage source, such as +5 VDC. The voltage at the second terminal is indicative of the switch position. That is, when the switch is closed, current flows through the pull-up resistor and the entire value of the voltage source is dropped across the resistor. Thus, zero volts DC (i.e., electrical ground) is on the second terminal of the switch. On the other hand, when the switch is opened, no current flows through the pull-up resistor, and, thus, no voltage is dropped thereacross. Therefore, the entire value of the voltage source (e.g., +5 VDC) is on the second terminal of the switch.

Corresponding simple circuitry for "reading" or sensing the status of the switch (i.e., either opened or closed) by sensing the voltage value on the second terminal may comprise a comparator or operational amplifier having two inputs. A first input is connected to a fixed or varying reference voltage value, while a second input is connected to the second terminal on the switch. The output signal of the comparator will assume one of two states, depending on whether the second terminal switch voltage is greater than or less than the reference voltage.

However, a switch may, over time, become corroded or contaminated and, thus, faulty in operation. When this occurs, the impedance across the switch terminals may be other than the normally zero (theoretically) impedance value when the switch is closed, and the normally infinite (theoretically) impedance value when the switch is opened. As a practical matter, a switch manufacturer may specify a switch closed impedance of 50 ohms or less, and a switch opened impedance of 100K ohms or more. That is, when the switch is faulty, a finite amount of impedance (e.g., somewhere between 50 ohms and 100K ohms) may be measured across the switch terminals. This switch impedance adds in series to the resistance or impedance of the pull-up resistor, which ultimately changes the voltage present on the second terminal of the switch, perhaps regardless of whether the switch is opened or closed. If the switch is fouled or corroded, the voltage at the second terminal of the switch may assume any value between 0 VDC and +5 VDC (or whatever the value of the positive or negative voltage source). Further, if this voltage is equal to the reference voltage on the comparator, the output of the comparator may oscillate which, depending on when the comparator output voltage is read, could indicate the switch is either open or closed.

Some electronic applications require a plurality of two-position switches to have their individual status scanned or sensed by a single interface circuit. This is to reduce the total amount of circuitry. Typically a multiplexer is used where the plurality of switches are connected to the inputs of the multiplexer. One of the inputs is selected to appear at the single output line of the multiplexer, and the multiplexer output is connected to one input of a comparator in a similar manner as described hereinbefore. Essentially, this is a scanned parallel to serial discrete switch interface.

A common prior art comparator interface utilizes conventional hysteresis circuitry that varies the reference voltage on the other comparator input (i.e., the reference input) depending on the condition of the last switch read. A problem with this scheme, however, is that when a switch becomes fouled or contaminated and develops a finite impedance value, the comparator may interpret the switch to be in the wrong state. This is because the reference voltage has been set by the previous reading of an unrelated discrete switch. That is, the reference voltage has "memory". Even though this comparator interface with hysteresis may better prevent oscillation of the comparator output voltage about the reference voltage value, it is similar to the non-hysteresis embodiment described hereinbefore in that it may or may not be able to detect a fouled or dirty switch.

SUMMARY OF THE INVENTION

Accordingly, it is a primary object of the present invention to provide an electronic circuit for sensing whether a two-position switch is opened, closed or faulty to some extent.

It is a general object of the present invention to sense when a two-position switch is faulty to some extent by sensing when the impedance across the switch terminals is of a finite value that lies within a range of preselected impedance values.

It is another object of the present invention to provide an electronic circuit for determining a fault condition of a switch by sensing when the voltage output on one terminal of the switch is within a predetermined range of voltage values.

It is yet another object of the present invention to provide comparator circuitry that senses the status of a plurality of switches that are multiplexed to the comparator circuitry.

The above and other objects and advantages of this invention will become more readily apparent when the following description is read in conjunction with the accompanying drawings.

To overcome the deficiencies of the prior art and to achieve the objects listed above, the present invention is directed to an electronic circuit that interfaces with one or more discrete, two-position switches to read the status of each switch and provide a pair of signals that, taken together, indicate either an opened, closed or faulty status of each switch.

In the preferred embodiment that senses the status of each of a plurality of two-position switches, each switch has a first terminal connected to electrical ground (i.e., 0 VDC) and a second terminal connected to one side of a pull-up resistor. The second side of the resistor connects to a positive voltage source (e.g., +5 VDC). The second terminal of the switch also connects to one input of a multiplexer having a plurality of inputs and a single output. At any one time, the multiplexer chooses the voltage on any one of its inputs to pass through to the single multiplexer output by way of a plurality of multiplexer selector lines. The multiplexer output is connected to both an inverting input of a first operational amplifier functioning as a comparator and a non-inverting input of a second operational amplifier also functioning as a comparator. A voltage divider provides a constant voltage of a first predetermined value (e.g., +3.5 VDC) to the non-inverting input of the first comparator. It also provides a constant voltage of a second predetermined value (e.g., +2.5 VDC) to the inverting input of the second comparator. These two reference voltage values comprise the end points for a range or "window" for the comparators, enabling the comparators to provide a "true hysteresis" function, as described in more detail hereinafter. Each comparator provides a single output line that has a binary logic level (i.e., logic low or logic high) indicative of whether the voltage at one input of the comparator is greater than or less than the voltage at the other input.

In operation, when any switch is opened, there is theoretically infinite impedance across the switch terminals. Therefore, no current flows through the pull-up resistor and the entire value of the voltage source (e.g., +5 VDC) is input to the multiplexer. When the multiplexer selects an opened switch to read, the +5 VDC switch voltage is fed to the aforementioned comparator inputs. The binary logic level output of the first comparator goes to a logic low, since the +5 VDC switch output voltage on the inverting input exceeds the +3.5 VDC reference voltage value on the non-inverting input. At the same time, the binary logic level output of the second comparator goes to a logic high, since the +5 VDC switch output voltage on the non-inverting input is greater than the +2.5 VDC on the inverting input.

When the switch is closed, there is theoretically zero impedance across the switch terminals and current flows through the pull-up resistor. The entire +5 VDC is dropped across the pull-up resistor such that 0 VDC is on the input to the multiplexer. When the multiplexer selects a closed switch to read, the 0 VDC switch voltage is fed to the aforementioned comparator inputs. The binary logic level output of the first comparator goes to a logic high, since the 0 VDC switch output voltage on the inverting input is less than the +3.5 VDC reference voltage value on the non-inverting input. At the same time, the binary logic level output of the second comparator goes to a logic low, since the 0 VDC switch output voltage on the non-inverting input is less than the +2.5 VDC reference voltage value on the inverting input.

If the switch is contaminated, faulty, corroded, dirty, etc., then there will be a finite resistance across its terminals. This resistance, regardless of whether the switch is opened or closed, adds in series with the resistance of the pull-up resistor. Now, the voltage input to the multiplexer is something other than 0 VDC or +5 VDC. According to a preferred embodiment of the present invention, the comparator reference voltages are chosen to create a "dead band" or window that is a range of voltages. A faulty switch is assumed to have a finite impedance between a certain range. This impedance, together with a desired amount of current flow through the pull-up resistor, determines ultimately the value of the pull-up resistor. When the switch is faulty to some extent, the voltage input to the multiplexer will fall between this "true hysteresis" window or dead band range. When this happens, both comparator outputs will be a logic high. This is the third of four possible output state combinations of two comparator outputs. The fourth combination, where both outputs are at a logic low, can only occur upon a fault of the comparators and not upon the status of any switch.

BRIEF DESCRIPTION OF THE DRAWINGS

The sole FIGURE is a schematic diagram of circuitry according to the present invention for interfacing with a plurality of two-position switches.

DETAILED DESCRIPTION OF THE PREFERRED EMBODIMENTS

Referring to the FIGURE, a preferred embodiment of electronic circuitry for interfacing with a plurality of discrete, two-position switches is illustrated and generally designated by the reference numeral 100. Each switch 104, 108 has two terminals 112, 116, 120, 124: a first terminal 116, 124 is connected to electrical ground 128 (i.e., 0 VDC), and a second terminal 112, 120 is connected through a pull-up resistor 132, 136 to a positive voltage source 140 (e.g., +5 VDC). The switch 104, 108 contains an arm 144, 148 that closes or opens the switch 104, 108 by connecting or disconnecting, respectively, the two switch terminals 112–124 together. The switch terminal 112, 120 connected to the pull-up resistor 132, 136 represents the output state or mode of the switch 104, 108 and is fed to an input 152, 156 of a multiplexer 160. The multiplexer 160 selects one input from among its plurality of inputs to pass onto its single output line 164. This output line 164 is connected to the inverting terminal 168 of a first operational amplifier 172 functioning as a comparator. The multiplexer output line 164 also connects to the non-inverting input 176 of a second operational amplifier 180 functioning as a comparator. A voltage divider network 184 comprised of three resistors, R1–R3 188–196, is connected in series between a positive voltage source 140 (e.g., +5 VDC) and ground 128 (e.g., 0 VDC). The node 200 between the first and second resistors 188–192 connects to the non-inverting input 204 of the first comparator 172. The node 208 between the second and third resistors 192, 196 connects to the inverting input 212 of the second comparator 180. Each comparator 172, 180 has an output line 216, 220 indicative of whether the voltage on the non-inverting input 204, 176 of that comparator 172, 180 is greater than or less than the voltage at the inverting input 168, 212 of that comparator 172, 180. The two comparator outputs 216, 220 taken together are indicative of a switch 104, 108 being opened, closed, or faulty.

Referring to the FIGURE in detail, a pair of switches, SW1 104 and SW2 108, are illustrated. The first switch, SW1 104, is in an opened position, while the second switch, SW2 108, is in a closed position. When opened, the switch 104 theoretically has a resistance or impedance of infinite value across its two terminals 112, 116. As a practical matter, however, a switch manufacturer typically specifies an opened impedance of 100K ohms or more. On the other hand, when closed, the switch 108 theoretically has a resistance or impedance of zero (i.e., a "short" circuit) across its terminals 120, 124. As a practical matter, however, a switch manufacturer typically specifies a closed switch impedance of 50 ohms or less. Each of the two switches 104, 108 has an associated pull-up resistor, R4 132 and R5 136, connected between one of its terminals 112, 120 and a positive voltage source 140 (e.g., +5 VDC). The other switch terminal 116, 124 is connected to ground 128 (i.e., 0 VDC).

When the switch 104 is opened, no current flows through the pull-up resistor, R4 132. Thus, no voltage is dropped across this pull-up resistor 132. The entire value of the voltage source 140 (+5 VDC) appears on this upper switch terminal 112, and is also input to the multiplexer 160 on the signal line 152. In contrast, when the switch 108 is closed, current flows through the pull-up resistor, R5 136. The entire +5 VDC positive voltage source 140 is dropped across this pull-up resistor 136. Thus, 0 VDC appears on this upper switch terminal 120 and is also applied to the multiplexer 160 on the signal line 156.

If the switch 104, 108 is faulty, as defined by the switch terminals 112–124 being contaminated, dirty, fouled, etc., then, regardless of whether the switch 104, 108 is opened or closed, there will be a finite value of resistance or impedance across the switch terminals 112–124. The circuitry 100 of the present invention is operable to detect, to some extent, this faulty condition of the switch.

The multiplexer 160 selects any one of its inputs to pass the input signal onto the single multiplexer output line 164. The multiplexer selects from among its inputs based on the multiplexer select lines 224, which may connect to a microprocessor (not shown). For example, if the multiplexer 160 has eight inputs, three multiplexer select lines 224 (i.e., $2^3=8$) are required.

The single multiplexer output line 164 connects to an inverting input 168 of a first operational amplifier 172 configured as a comparator. The multiplexer output line 164 also connects to a non-inverting input 176 of a second operational amplifier 180 configured as a comparator. The operational amplifiers 172, 180 may comprise the Model LF147, provided by National Semiconductor. A voltage divider network 184 comprised of three resistors, R1 188, R2 192 and R3 196, connected in series is also provided. A first resistor, R1 188, connects between a positive voltage source 140 (e.g., +5 VDC) and a non-inverting input 204 of the first comparator 172, and also to one side of a second resistor, R2 192. The other side of this second resistor 192 connects to one side of a third resistor, R3 196, and also to the inverting input 212 of the second comparator 180. The other side of this third resistor, R3 196, connects to electrical ground 128 (e.g., 0 VDC). In a preferred, yet exemplary, embodiment of the present invention, the values for the three resistors, R1 188, R2 192 and R3 196 of the resistor divider network 184 are chosen such that +3.5 VDC is applied at the node 200 to the non-inverting input 204 of the first comparator 172, while +2.5 VDC is applied at the node 208 to the inverting input 212 of the second comparator 180. As described in detail hereinafter, this voltage range between +2.5 VDC and +3.5 VDC comprises the true hysteresis window, or "dead band" range of the circuitry 100 of the present invention. Further, the voltages of +3.5 VDC and +2.5VDC are referred to as the reference voltages or "trip" points of the two comparators 172, 180.

In operation, when the multiplexer 160 selects an opened switch (e.g., SW1 104) to "read" its status by passing the voltage level at the upper terminal 112 of the switch 104 through to the multiplexer output line 164 and to the comparator inputs 168, 176, the opened switch 104 provides, as described hereinbefore, +5 VDC to the aforementioned comparator inputs 168, 176. Since this voltage value is greater than the reference voltage value on the first comparator 172, the output of the first comparator 172 on the line 216 will be a logic low. In contrast, since this voltage value of the switch 104 is greater than the reference or trip point of the second comparator 180, the output of the second comparator 180 on the line 220 will be a logic high. Taken together, these two comparator outputs on the lines 216, 220 are indicative of an opened switch condition. Although not shown, the comparator outputs 216, 220 may be connected to subsequent signal processing circuitry, such as a microprocessor, that interprets the status of each switch 104, 108.

On the other hand, if the multiplexer 160 selects the closed switch (e.g., SW2 108) to pass the voltage level at its upper terminal 120 on the line 156 through to the multiplexer output line 164, then 0 VDC is passed to the aforementioned comparator inputs 168, 176. Since this input voltage on the inverting input 168 of the first comparator 172 is less than the reference voltage or trip point on the non-inverting input 204, the output of the first comparator 172 is a logic high. In contrast, since the input voltage on the non-inverting input 176 of the second comparator 180 is less than the reference voltage or trip point on the inverting input 212 of the second comparator 180, the output of the second comparator 180 on the line 220 is a logic low. As compared to the comparator outputs 216, 220 associated with an opened switch 104 described hereinbefore, the comparator outputs 216, 220 associated with an opened switch 104 are of the opposite states or logic levels.

If, for some reason, any switch 104, 108 becomes contaminated or faulty, the switch will develop some finite amount of resistance or impedance across its terminals 112–124 that is in series with the resistance of the pull-up resistor 132, 136. This finite switch impedance may occur either when the switch 104, 108 is opened or closed or both. Such fault condition is generally unpredictable, along with the exact value of the finite impedance across the switch terminals 112–124.

The circuitry 100 of the present invention indicates a faulty switch when the voltage at the upper terminal 112, 120 of the switch 104, 108 is a value that lies between the window of the two reference voltages applied to the comparator inputs 204, 212. In the exemplary embodiment of the present invention described herein, the faulty switch voltage is between +2.5 VDC and +3.5 VDC. The switch resistance of the faulty switch required to present a voltage that lies within this "dead band" range is directly dependent on the resistance value of the pull-up resistor 132, 136, and also on the amount of current that is desired to pass through the switch terminals 112–124 when the switch is closed. For example, if a relatively low amount of current (e.g., less than one milliamp) is desired to pass through the switch, then a relatively high value (e.g., approximately 10K ohms) value for the pull-up resistor 132, 136 is required. On the other hand, if the switch can tolerate a higher current (e.g., 25 milliamps or greater), then a lower value for the pull-up resistor 132, 136 may be utilized. The specification for the switch provided by the manufacturer should be consulted when selecting the pull-up resistor value.

The switch resistance, $R_s$, required to present a voltage within the "dead band" region can be described by the following equation:

$$R_s=(V_{ref}*R_p)/(V_p-V_{ref}) \qquad \text{(EQ. 1)}$$

For example, if a 100 ohm pull-up resistor, $R_p$, is utilized with the aforementioned reference voltages, $V_{ref}$, of +2.5 VDC and +3.5 VDC, together with a pull-up voltage, $V_p$, of 5 VDC, the "dead band" resistive range for a faulty switch is 100 ohms for the low reference voltage of +2.5 VDC, and 233 ohms for the upper reference voltage of +3.5 VDC. Any finite switch resistance between 100 ohms and 233 ohms is then interpreted as a faulty switch. Of course, a faulty switch could exhibit a resistance outside of this 100–233 ohm range, but the switch would not be interpreted as faulty in this exemplary embodiment of the present invention.

On the other hand, if a wider range for the "dead band" switch resistance value required to present a voltage that lies between two reference voltages is required, then a higher value for the pull-up resistor 132, 136 may be utilized. In the alternative, a wider range for the reference or trip point voltages applied to the comparators 172, 180 may also be utilized as well. These reference voltages may be selected by appropriate selection of the resistors 188–196 within the resistor divider network 184.

In any event, if a switch 104, 108 is faulty and exhibits a finite resistance that lies within the "dead band" resistance range, the resulting voltage on the upper terminal 112, 120 of the switch 104, 108 will be of a value such that the output of the first comparator 172 on the line 216 will be a logic high, and the output of the second comparator 180 on the line 220 will also be a logic high. Thus, if both comparator outputs 216, 220 are a logic high, the switch 104, 108 will be considered to be in a failed condition. When this condition is present, the circuitry decoding the output states of the comparators will keep the last known good state of the switch and flag a switch fault.

Finally, if both comparator outputs 216, 220 are a logic low, the switch 104, 108 may also be considered to be defective. However, such a condition should only occur upon a failure of the interface circuitry 100 of the present invention, and not due to any of the aforementioned three different states of the switches 104, 108.

The FIGURE also illustrates a test signal on the line 228 that functions as a "built-in-test" feature to allow testing of the circuitry 100 of the present invention. The test signal 228 can be set at three different voltage levels to simulate an opened switch, a closed switch, or a faulty switch.

The present invention is predicated on the fact that a faulty switch will exhibit some finite resistance value that lies between the two extreme resistance values of the switch that represent the opened and closed switch positions. Further, by using a pair of comparators 172, 180, the circuitry 100 of the present invention contains no "memory" as in the prior art described hereinbefore. Therefore, the circuitry 100 is not biased (i.e., does not have its reference voltages applied to the comparators) dependent upon a previous reading of a different switch. This has utility when a number of switches 104, 108 are being read in a scanned parallel to serial discrete switch interface by the dual comparator arrangement of the present invention.

The present invention has been described as being able to read a plurality of switches 104, 108 that are multiplexed in time to the comparator circuitry. That is, the circuitry 100 includes a scanned parallel-to-serial interface. However, it is to be understood that the broadest scope of the present invention contemplates merely a single switch being fed directly to the comparator circuitry of the present invention. In other words, the broadest scope of the present invention does not require a multiplexer 160. Further, the present invention has been described as utilizing voltages of +5 VDC and 0 VDC across the series combination of the switch and the pull-up resistor. However, such voltages are purely exemplary. It suffices for the present invention that voltages be provided of a different value to create a voltage drop across (and, thus, a current through) the pull-up resistor 132, 136.

Further, the invention has been described as utilizing comparators 172, 180 comprised of operational amplifiers. However, this is strictly exemplary. The comparators 172, 180 may comprise an arrangement of other electronic components, such as transistors, that are within the ordinary skill of the art in light of the teachings herein. Still further, the reference voltages applied to the respective comparator inputs 204, 212 have been described as being provided by a resistor divider network 184. However, this network 184 is purely exemplary. Other schemes for providing reference voltages to the comparator inputs may be utilized without departing from the broadest scope of the present invention.

It should be understood by those skilled in the art that obvious structural modifications can be made without departing from the spirit of the invention. Accordingly, reference should be made primarily to the accompanying claims, rather than the foregoing specification, to determine the scope of the invention.

We claim:

1. Apparatus for interfacing with at least one two-position switch that is operative between an opened position in which there is no physical contact between two terminals of the switch, thereby defining an opened circuit and an infinite impedance of the switch between the two terminals, and a closed position in which the two terminals are physically shorted together, thereby defining a closed circuit and zero impedance between the two terminals, the apparatus being operative to indicate when the switch is in the opened and closed positions, the apparatus also operative to indicate a faulty condition of the switch in which the switch has a finite impedance value that is between a predetermined impedance range, the apparatus comprising:

a. a resistor connected at one end to a first predetermined voltage value and connected at a second opposite end to the first terminal of the: switch, the second terminal of the switch being operable to be connected to a second predetermined voltage value that is different than the first predetermined voltage value; and b. means, connected with the first terminal of the switch, for determining when the switch is closed by determining when the switch has an impedance value that is less than a predetermined low impedance value, for determining when the switch is opened by determining when the switch has an impedance value that is greater than a predetermined high impedance value, and for determining when the switch is faulty by determining when the switch has an impedance value that is in between the predetermined high impedance value and the predetermined low impedance value.

2. The apparatus of claim 1, wherein the means for determining comprises means for comparing a voltage on the first terminal of the switch with one or more predetermined voltages to determine when the switch is closed, opened or faulty.

3. The apparatus of claim 1, wherein the means for determining comprises means for determining when the switch is closed by determining when the switch has an impedance value that is less than the predetermined low impedance value by comparing a corresponding voltage on the first terminal of the switch with a predetermined first voltage value.

4. The apparatus of claim 3, wherein the means for determining comprises means for determining when the switch is opened by determining when the switch has an impedance value that is greater than the predetermined high impedance value by comparing the corresponding voltage value on the first terminal of the switch with a predetermined second voltage value.

5. The apparatus of claim 4, wherein the means for determining comprises means for determining when the switch is faulty by determining when the switch has an impedance that is in between the predetermined high impedance value and the predetermined low impedance value by determining when the corresponding voltage on the first terminal of the switch is in between the predetermined first voltage value and the predetermined second voltage value.

6. The apparatus of claim 1, wherein the means for determining comprises first and second comparator means, the first comparator comprising means for comparing a corresponding voltage on the first terminal of the switch that is indicative of the impedance value of the switch with a first predetermined voltage value, the second comparator means comprising means for comparing the corresponding voltage on the second terminal of the switch with a second predetermined voltage value.

7. The apparatus of claim 6, wherein the first and second comparator means together comprise means for indicating when the switch is closed when the voltage on the first terminal of the switch is less than both the first and second predetermined voltage values, for indicating when the switch is opened when the voltage on the first terminal of the switch is greater than both the first and second predetermined voltage values, and for indicating when the switch is faulty when the voltage on the first terminal of the switch is between the first and second predetermined voltage values.

8. The apparatus of claim 7, wherein the first predetermined voltage value is different in value than the second predetermined voltage value.

9. The apparatus of claim 7, wherein the first predetermined voltage value is greater in value than the second predetermined voltage value.

10. The apparatus of claim 1, further comprising a multiplexer having a plurality of inputs and at least one output, a plurality of the two-position switches being operable to be connected with the corresponding plurality of inputs of the multiplexer, the multiplexer being operable to select any one of the multiplexer inputs to be connected with the multiplexer output.

11. The apparatus of claim 10, further comprising a test signal being connectable with one of the multiplexer inputs, the test signal being operative to indicate either a closed position of one of the switches, an opened position of one of the switches, or a fault condition of one of the switches.

12. Circuitry for connecting with one or more switches, each switch being operable between at least two positions, a first position being where the switch is closed and a second position being where the switch is opened, the circuitry comprising:

a. first comparator means for comparing an impedance of the switch with a first predetermined voltage to determine if the switch is opened, closed or faulty, the first predetermined voltage corresponding to an upper limit of an impedance value of the switch; and b. second comparator means for comparing the impedance of the switch with a second predetermined voltage to determine if the switch is opened, closed or faulty, the second predetermined voltage corresponding to a lower limit of an impedance value of the switch.

13. The circuitry of claim 12, wherein the first comparator means and the second comparator means together comprise means for determining when the switch is faulty when the impedance of the switch is between the first and second predetermined voltages.

14. The circuitry of claim 12, wherein the first comparator means and the second comparator means together comprises means for determining when the switch is closed when the impedance of the switch is less than both the first and second predetermined voltages.

15. The circuitry of claim 12, wherein the first comparator means and the second comparator means together comprise means for determining when the switch is opened when the impedance of the switch is greater than both the first and second predetermined voltages.

16. The circuitry of claim 12, further comprising means, connectable with the switch, for transducing the impedance value of the switch into a corresponding switch voltage value.

17. The circuitry of claim 16, wherein the means for transducing comprises a resistor connected between one terminal of the switch and a certain voltage value.

18. The circuitry of claim 16, wherein the first comparator means determines if the switch is opened, closed or faulty by comparing the switch voltage value to the first determined voltage, and when the second comparator means determines if the switch is opened, closed or faulty by comparing the switch voltage value to the second predetermined voltage.

19. The circuitry of claim 12, further comprising a multiplexer having a plurality of inputs and at least one output, a plurality of the switches being operable to be connected with the corresponding plurality of inputs of the multiplexer, the multiplexer being operable to select any one of the multiplexer inputs to be connected with the multiplexer output.

20. The circuitry of claim 19, further comprising a test signal connectable with one of the multiplexer inputs, the test signal being operable to simulate a closed position of a switch, an opened position of a switch, or a faulty condition of a switch.

* * * * *